(12) United States Patent
Shchekin et al.

(10) Patent No.: US 7,626,210 B2
(45) Date of Patent: Dec. 1, 2009

(54) LOW PROFILE SIDE EMITTING LED

(75) Inventors: Oleg Borisovich Shchekin, San Francisco, CA (US); Mark Pugh, Los Gatos, CA (US); Gerard Harbers, Sunnyvale, CA (US); Michael R. Krames, Los Altos, CA (US); John E. Epler, Milpitas, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 490 days.

(21) Appl. No.: 11/423,419

(22) Filed: Jun. 9, 2006

(65) Prior Publication Data

US 2007/0284600 A1    Dec. 13, 2007

(51) Int. Cl.
*H01L 29/20* (2006.01)
(52) U.S. Cl. ............... 257/98; 257/E31.127; 385/4; 362/610; 362/612
(58) Field of Classification Search ......... 257/E31.127, 257/98; 385/4; 362/610, 612
See application file for complete search history.

(56) References Cited

U.S. PATENT DOCUMENTS

2004/0028095 A1* 2/2004 Ishida et al. ............ 372/36
2004/0065886 A1* 4/2004 Eliashevich et al. ........ 257/79
2004/0217362 A1* 11/2004 Slater et al. ............... 257/79

* cited by examiner

Primary Examiner—Davienne Monbleau
Assistant Examiner—Matthew Reames
(74) Attorney, Agent, or Firm—Patent Law Group; Brian Ogonowsky

(57) ABSTRACT

Low profile, side-emitting LEDs are described, where all light is efficiently emitted within a relatively narrow angle generally parallel to the surface of the light-generating active layer. The LEDs enable the creation of very thin backlights for backlighting an LCD. In one embodiment, the LED is a flip chip with the n and p electrodes on the same side of the LED, and the LED is mounted electrode-side down on a submount. A reflector is provided on the top surface of the LED so that light impinging on the reflector is reflected back toward the active layer and eventually exits through a side surface of the LED. A waveguide layer and/or one or more phosphors layers are deposed between the semiconductor layers and the reflector for increasing the side emission area for increased efficiency. Side-emitting LEDs with a thickness of between 0.2-0.4 mm can be created.

24 Claims, 6 Drawing Sheets

LOW PROFILE SIDE EMITTING LED

FIELD OF INVENTION

This invention relates to illumination devices using non-lasing light emitting diodes (LEDs) and, in particular, to techniques for improving backlights and other similar illumination devices using side-emitting LEDs.

BACKGROUND

Liquid crystal displays (LCDs) are commonly used in cell phones, personal digital assistants (PDAs), laptop computers, desktop monitors, and television applications. One embodiment of the present invention deals with a color, transmissive LCD that requires backlighting, where the backlight may use one or more LEDs emitting white or colored light. The LEDs are distinguished from laser diodes in that the LEDs emit incoherent light.

In many small displays, such as for cell phones, PDAs, and other devices, it is important that the display be thin. Further, since such small displays are typically battery operated, it is important that the light from the LED is efficiently coupled to the back of the LCD.

LEDs that emit a majority of light in a direction generally parallel to a circuit board are known and have been used in backlights. It is space-efficient in small devices for the circuit board powering the LEDs to be parallel with the LCD. The side-emitted light is coupled into a side of the backlight waveguide, causing the height of the LED to be a limiting factor in making the backlight thinner.

One type of side-emitting LED is a "top emitting" LED that is packaged so that the LED's light emitting active layer is perpendicular to the board's surface. Side-emitting LEDs have also been created by providing a side-emitting lens over a conventional LED, causing the light to be reflected out only through the sides of the lens. These types of side-emitting LEDs do not have a low profile.

Therefore, lower profile side-emitting LEDs are needed along with an efficient backlight incorporating such LEDs.

SUMMARY

Various non-lasing LED designs are described herein for creating an improved backlight for backlighting an LCD. The backlight may be also used for other illumination applications. The LEDs are side-emitting, where all light is efficiently emitted within a relatively narrow angle generally parallel to the surface of the light-generating active layer. No lenses are used to create the side emission. The LEDs have a low profile, allowing a backlight to be made very thin.

The LED comprises an n-type layer, a p-type layer, and an active layer sandwiched between the n and p layers. The LED is a flip chip with the n and p electrodes on the same side of the LED.

On the surface of the LED opposite to the electrode side is formed any number of other layers including phosphor layers for wavelength converting the light emitted from the active layer, light scattering layers, waveguide layers, dichroic mirrors, and other layers. A reflector is provided over these other layers so that light impinging on the reflector is reflected back toward the active layer and eventually exits through a side surface of the LED. It is important to provide additional layers between the semiconductor layers and the reflector to increase the side emission area for increased extraction efficiency. The phosphor layers may by red, green, blue, YAG, or a combination of phosphors.

The LED is mounted electrode-side down on a submount. The submount is then surface mounted on a printed circuit board coupled to a power supply.

The resulting LED has a very low profile since it is a flip chip and uses no lens for its side emission. The LED can emit white light or light of any other color.

A backlight is described where the backlight comprises a thin polymer waveguide with a bottom reflective surface and a top emitting surface. A liquid crystal layer is positioned over the top surface of the waveguide. A generally square side-emitting LED is inserted into an opening in the backlight, where the light-emitting sides of the LED are at approximately 45 degrees relative to a reflective rear sidewall of the waveguide. The light emitted from the LED is efficiently coupled to the waveguide and is reflected out through the top of the waveguide to the liquid crystal layer.

BRIEF DESCRIPTION OF THE DRAWINGS

Elements that are similar or identical in the various figures are labeled with the same numeral.

DETAILED DESCRIPTION

Embodiments of the present invention comprise low profile side-emitting LEDs that enable the construction of thin backlights for LCD applications and other applications.

Figure 1:
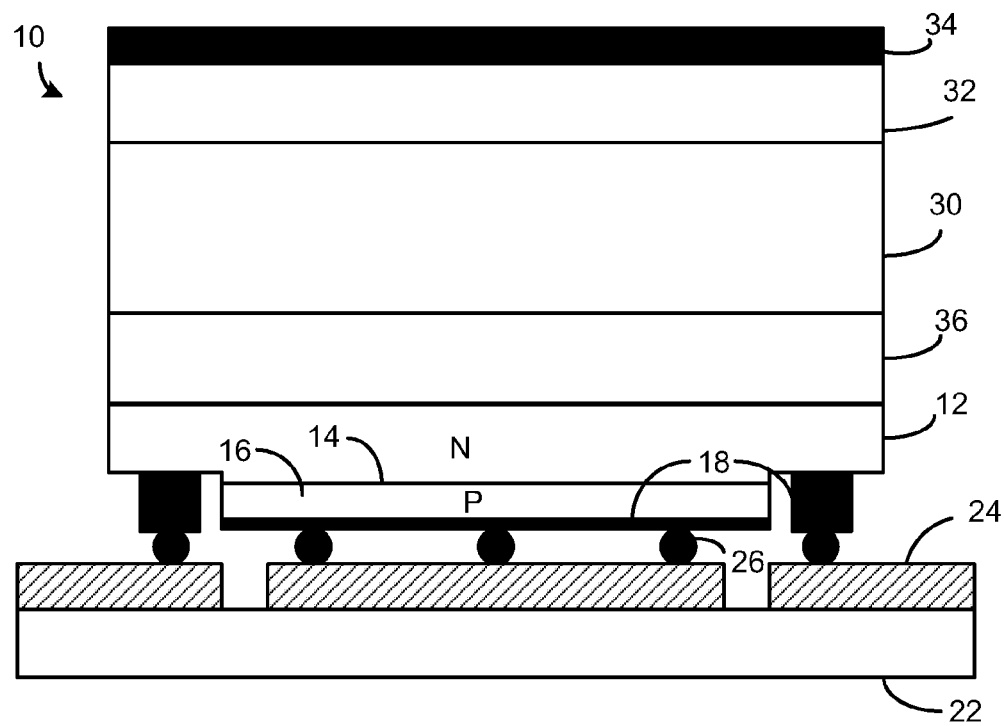
FIG. 1 is a side view of an LED in accordance with a first embodiment of the invention.

FIG. 1 is a side view of a first embodiment of a side-emitting LED 10. In one embodiment, the thickness of the side light emitting surface is 0.2-0.4 mm. In another embodiment the thickness of the side light emitting surfaces is 0.2-0.6 mm.

The present invention applies to LEDs of any material system, such as AlInGaP (typically for emitting red to yellow) or GaN (typically for emitting green to UV). An LED is formed on a starting growth substrate, such as sapphire, SiC, or GaAs, depending on the type of LED to be formed. Generally, an n-layer 12 is formed followed by an active layer 14, followed by a p-layer 16. The p-layer 16 is etched to expose a portion of the underlying n-layer 14. Reflective metal electrodes 18 (e.g., silver, aluminum, or an alloy) are then formed over the surface of the LED to contact the n and p layers. When the diode is forward biased, the active layer 14 emits light whose wavelength is determined by the composition of the active layer. Forming such LEDs is well known and need not be described in further detail. Forming LEDs of all visible wavelengths, mounting such LEDs on a submount, and providing power to the LEDs via a PCB are described in U.S. Pat. No. 6,828,596 to Steigerwald et al. and U.S. Pat. No. 6,876,008 to Bhat et al., both assigned to the present assignee and incorporated herein by reference.

The semiconductor layers of the LED will typically have a total thickness of less than 100 microns (0.1 mm).

The LED is then mounted on a submount 22 as a flip chip. The submount 22 contains metal electrodes 24 that are soldered or ultrasonically welded to the metal 18 on the LED via solder balls 26. Other types of bonding can also be used. The submount electrodes 24 are electrically connected (e.g., by through holes) to pads on the bottom of the submount so the submount can be surface mounted to a printed circuit board coupled to a power supply. The submount 22 may be formed of any suitable material, such as ceramic, silicon, aluminum, etc. If the submount material is conductive, an insulating layer is formed over the substrate material, and the metal electrode pattern is formed over the insulating layer. The submount 22 acts as a mechanical support, provides an electrical interface between the delicate n and p electrodes on the LED chip and a power supply, and provides heat sinking. If multiple LEDs are used as a light source, the submount may also provide interconnections between the LEDs. Submounts are well known.

To cause the LED 10 to have a very low profile, and to prevent light from being absorbed by the growth substrate, the growth substrate may be removed, such as by CMP. In one embodiment, removal of the growth substrate is performed after the LEDs are mounted on their submounts and prior to the LEDs and submounts being diced.

After the growth substrate is optionally removed, optical elements are formed over the n-layer 12 that enhance the side emission of the LED 10. In one embodiment, the optical elements include a clear wave guiding layer 30, a scattering layer 32 incorporating reflective particles or a roughed/prism surface, and a top reflective layer 34. The wave guiding layer 30 may be formed of any suitable transparent or translucent organic or inorganic material. A lower layer 36 may be a dichroic mirror or a one-way mirror so that light downwardly reflected by reflective layer 34 is not absorbed by the semiconductor layers.

If the growth substrate is transparent, such as sapphire, the optical layers may be formed over the growth substrate, where the sapphire substrate acts as a waveguide. The growth substrate may also be reduced in thickness without being totally removed.

The layers may include a planar phosphor layer for converting the wavelength of the light emitted from the active layer 14. A planar phosphor layer may be preformed as a ceramic sheet and affixed to the LED layers, or the phosphor particles may be thin-film deposited, such as by electrophoresis. If a phosphor layer is used, the active layer 14 will typically emit blue or UV light, and the phosphor will convert the wavelength to one or more other colors to create white light or another color. Other embodiments using phosphor are described below.

The reflector 34 may be specular or diffusing. A specular reflector may be a distributed Bragg reflector (DBR) formed of organic or inorganic layers. The specular reflector may also be a layer of aluminum or other reflective metal, or a combination of DBR and metal. A diffusing reflector may be formed of a metal deposited on a roughed surface or a diffusing material such as a suitable white paint.

In another embodiment, there is only a single waveguide layer between the n-layer 12 and the reflector 34.

Virtually all light emitted by the active layer 14 is either directly emitted through the sides of the LED, or emitted through the sides after one or more internal reflections, where the sides are substantially perpendicular to the major surface of the active layer 14. Light that impinges upon a side of the wave guiding layer 30 that is less than the critical angle will be reflected back into the LED. Therefore, a scattering layer 32 or diffusing reflector 34 generally improves the efficiency of the side emission by causing the light to be reflected at many angles and ultimately at less than the critical angle. Due to such internal reflections, the light output from the LED 10 will be at a small angle relative to the plane of the active layer.

The resulting LED 10 has a very low profile. By making the LED sides thicker, the efficiency will increase. The layers overlying the semiconductor layers should be at least as thick as the semiconductor layers to substantially increase the height of the side emission area. Accordingly, a majority of the light will be emitted through the sides of the layers overlying the semiconductor layers.

Figure 2:
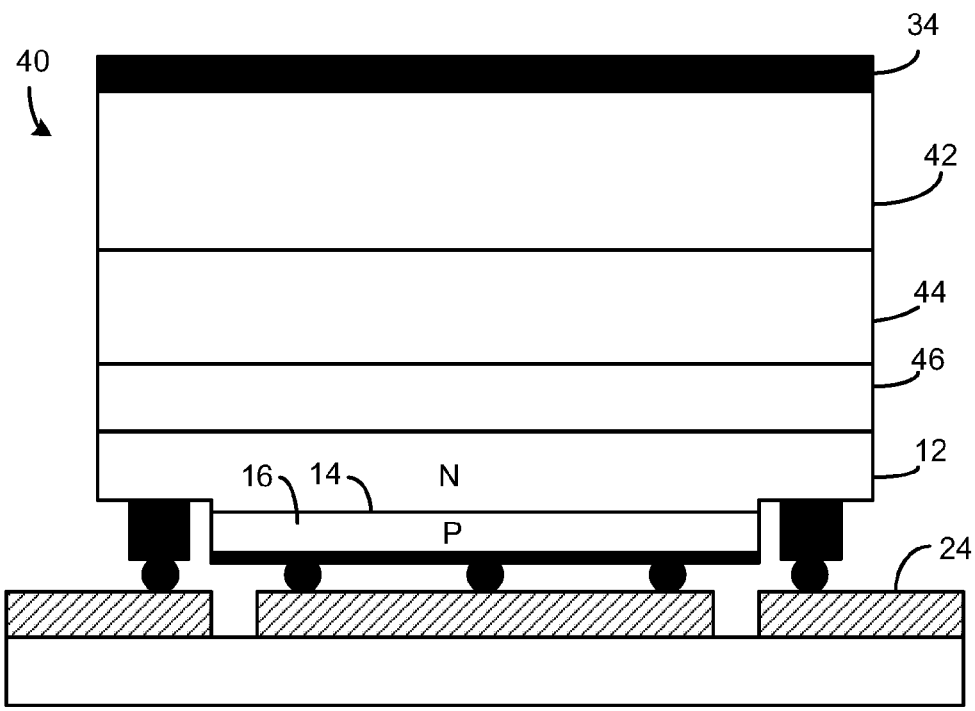
FIG. 2 is a side view of an LED in accordance with a second embodiment of the invention.

FIG. 2 is a side view of a second embodiment of a side-emitting LED 40, where the active layer 14 emits blue light. A phosphor layer 42 of Ce:YAG emits a yellow light when energized by the blue light. The emitted blue light is combined with the yellow light to create white light. The spectrum of the emitted light depends largely on the Ce doping in the phosphor as well as the thickness of the phosphor layer 42. The phosphor layer 42 may be sintered phosphor particles or phosphor particles in a transparent or translucent binder, which may be organic or inorganic. The phosphor layer 42 also scatters the light. Layer 44 is a clear or scattering spacer layer that increases the efficiency of the LED 40 by increasing the area of the sides. The thickness of layer 44 also affects the mix of yellow and blue light emitted by the LED 40. Layer 46 is a dichroic mirror that passes the blue light but reflects back the yellow light. The top reflector 34 ensures all light escapes through the sides.

Figure 3:
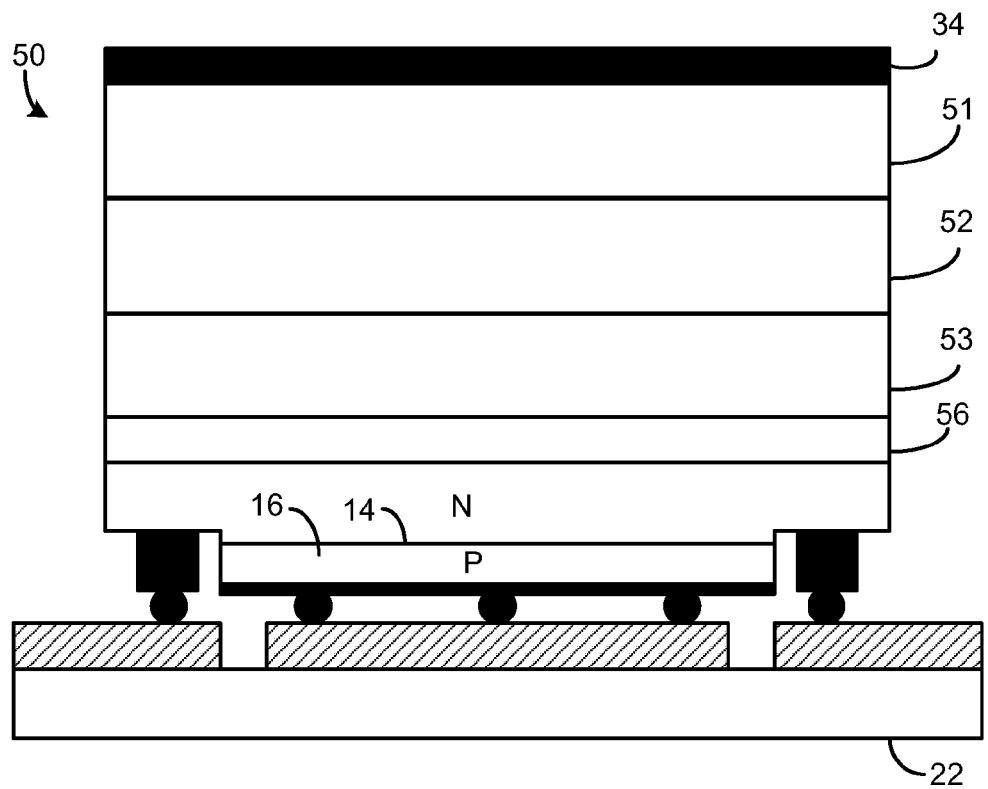
FIG. 3 is a side view of an LED in accordance with a third embodiment of the invention.

FIG. 3 is a side view of a third embodiment of a side-emitting LED 50 that emits white light or any other color of light. The active layer 14 emits blue or UV light. For a UV embodiment, a red phosphor layer 51, a green phosphor layer 52, and a blue phosphor layer 53 are stacked. The phosphor layers may be preformed sintered layers or phosphor particles in a binder. The phosphor layers allow some UV light to pass through to the above layer. Also, the emitted light from an underlying phosphor may energize an overlying phosphor layer. The thicknesses and compositions of the phosphor layers determine the white point of the emitted light.

If the active layer 14 emits blue light, the blue phosphor layer 53 can be omitted or substituted with a transparent or scattering spacer.

The different phosphors may also be mixed into a single layer. All the phosphors mentioned herein are well known types that are commercially available.

A dichroic mirror 56 that passes the active layer light but reflects other wavelengths may be used to prevent absorption of downwardly reflected light by the semiconductor layers.

If the LED 50 were intended to emit just blue light, the various layers may be substituted by non-absorbing optical elements, such as sapphire or silicone, used as waveguides and spacers for increasing efficiency.

Figure 4:
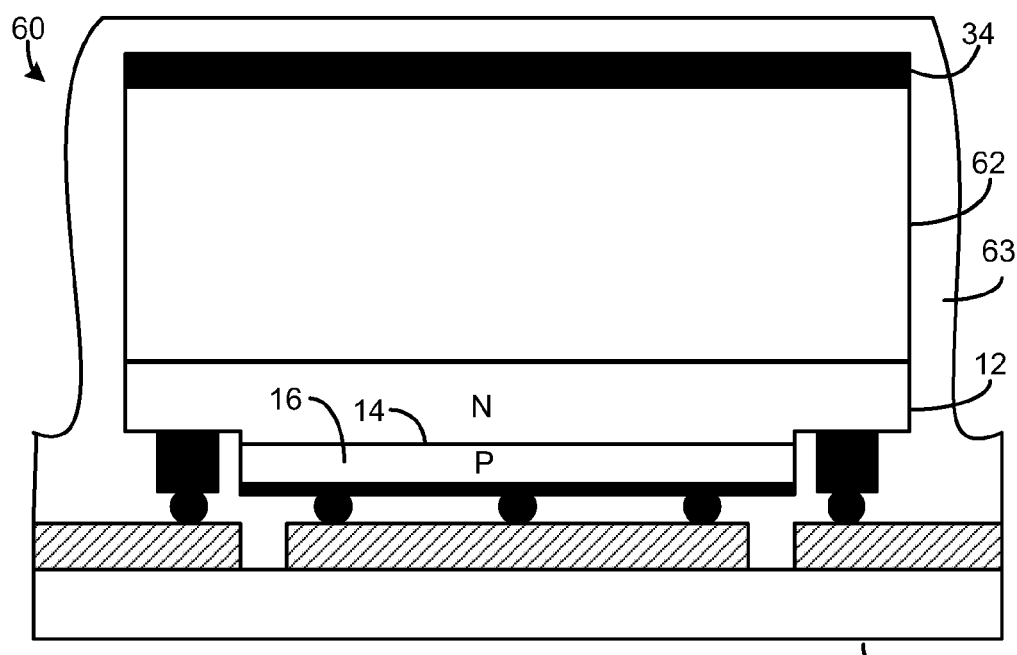
FIG. 4 is a side view of an LED in accordance with a fourth embodiment of the invention.

FIG. 4 is a side view of a fourth embodiment of a side-emitting LED 60. LED 60 emits white light. The active layer 14 emits blue light. A transparent waveguide 62 and reflector 34 causes the blue light to be emitted from the sides of the waveguide 62 and the sides of the semiconductor layers. The LED 60 is coated with a layer of Ce:YAG phosphor 63, which emits yellow light when energized by blue light. The phosphor may be electrophoretically deposited phosphor particles encapsulated in silicone. A portion of the blue light is down-converted by the phosphor to create yellow light, and the blue light and yellow light mix to create white light.

The reflector 34 in all embodiments may be specular or diffusing. As in all embodiments, increasing the area of the sides increases the light extraction efficiency.

Figure 5:
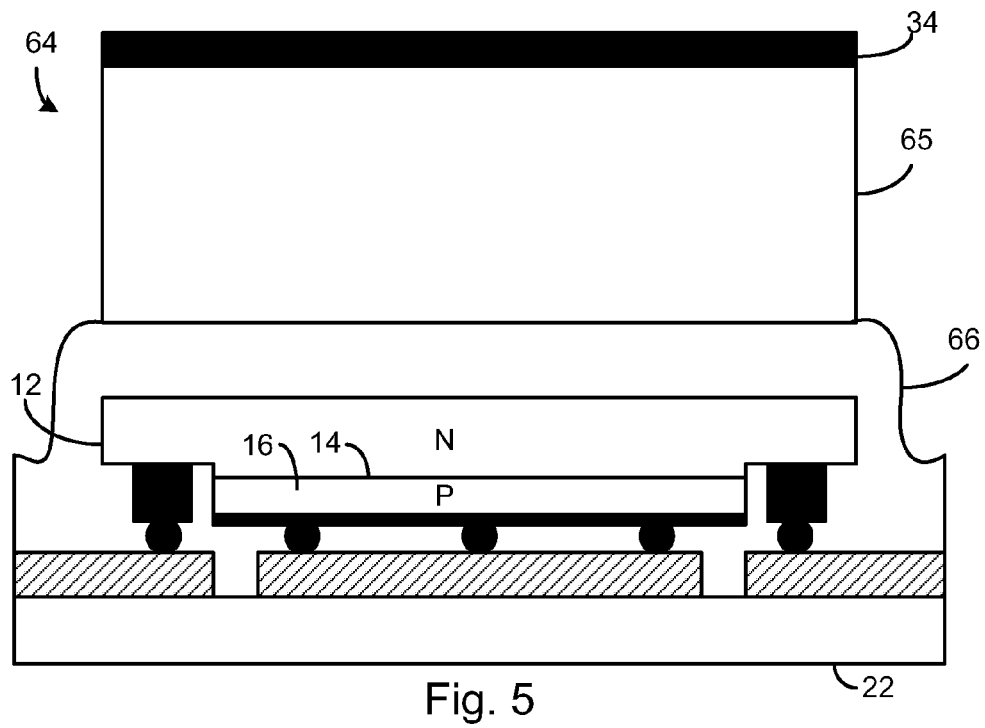
FIG. 5 is a side view of an LED in accordance with a fifth embodiment of the invention.

FIG. 5 is a side view of a fifth embodiment of a side-emitting LED 64, which emits white light. The active layer 14 emits blue light. Prior to forming a clear waveguide layer 65 over the semiconductor layers, the semiconductor layers are covered with a Ce:YAG phosphor layer 66, which may be electrophoretically deposited phosphor particles encapsulated in silicone. The energized phosphor emits yellow light. The blue light mixes with the yellow light so the LED 64 emits white light. The thickness and composition of the phosphor layer 66 determines the mixture of yellow and blue light.

Figure 6:
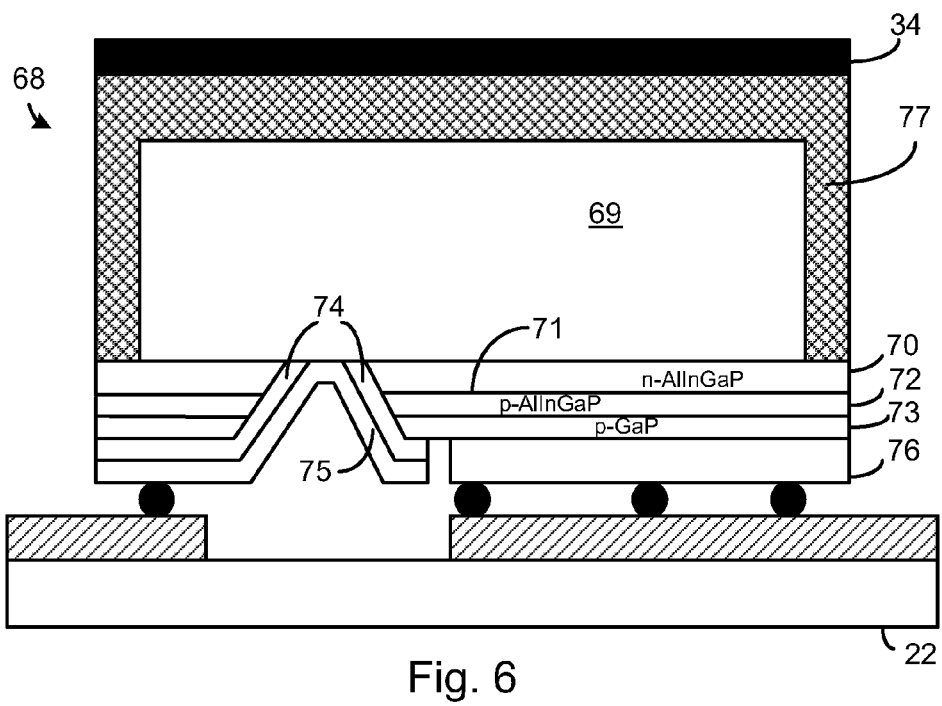
FIG. 6 is a cross-sectional view of an LED in accordance with a sixth embodiment of the invention.

FIG. 6 is a cross-sectional view of a sixth embodiment of a side-emitting LED 68 that generates a red light. The LED comprises a thick n-GaP layer 69 (used as a waveguide), an n-AlInGaP cladding layer 70, an active layer 71, a p-AlInGaP cladding layer 72, and a p-GaP layer 73. The layers are etched to expose a portion of the conductive n-GaP layer 69. A layer of insulation 74 is formed over the sides of the layers 70-74, and a metal layer 75 is then deposited to contact the n-GaP layer 69. A reflective metal layer 76 contacts the p-GaP layer 73. Current through the metal layers 75 and 76 causes the active layer 71 to emit red light.

The outer surface 77 of the n-Gap layer 69 is etched to be roughened to scatter light, such as made porous, dimpled, prismed, or any other type of roughening. This increases the extraction of light from the sides of the chip. Such processing of the outer surface of the LED may be performed on the other embodiments of LEDs described herein to increase light extraction. The top reflector 34, formed after the etching of the n-GaP layer 69, ensures that all light escapes from the sides.

The depth of the roughened sides of the n-GaP layer 69 is preferably less than the depth of the roughened top of the n-GaP layer. This is because it is more important to scatter the light off the top surface in all directions. The scattered light impinging on the side walls will be emitted by the roughened surface of the side walls. By making the depth of the roughened side walls thin, the emission angle is smaller for the side emitting LED.

Side emitting flip-chip LEDs provide a number of advantages when used in lighting systems. In backlights, side emitting flip chip LEDs allow utilization of thinner waveguides, fewer LEDs, better illumination uniformity, and higher efficiency due to better coupling of light into a waveguide.

Figure 7:
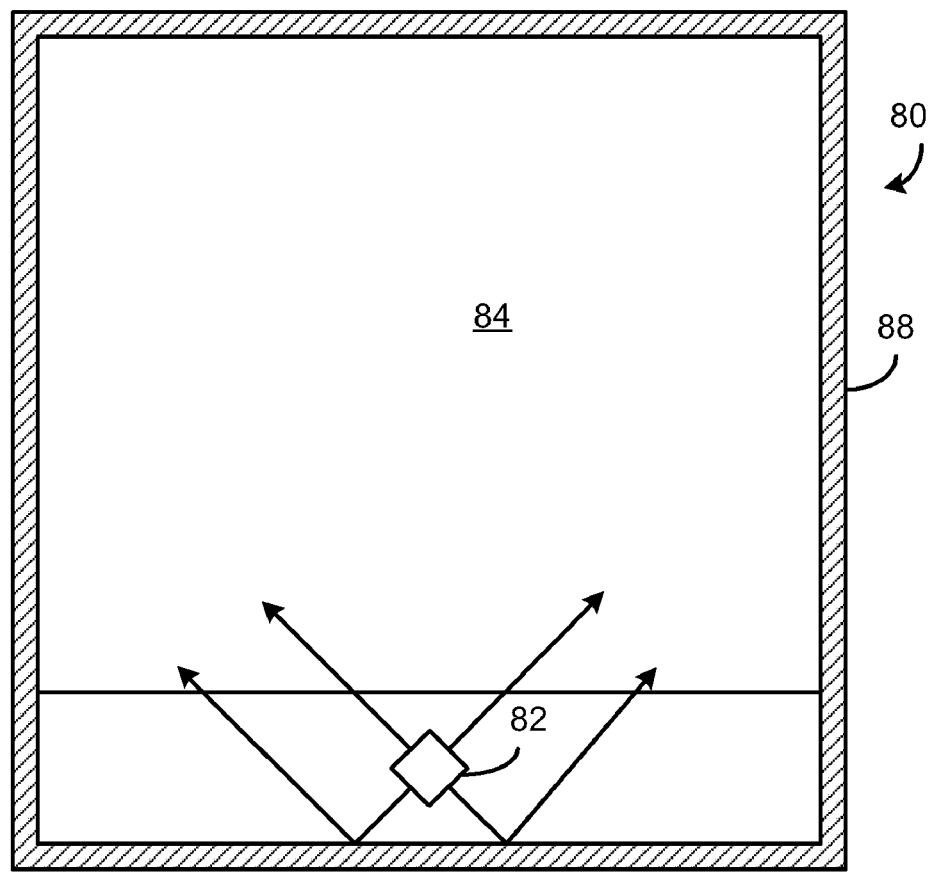
FIG. 7 is a top down view of a thin backlight showing the preferred position of the side-emitting LED.

FIG. 7 is a top down view of a 2-inch display backlight 80 that may be used in a color LCD of a cell phone. A single flip-chip side-emitting LED 82, in accordance with any of the embodiments described herein, is incorporated into the transparent waveguide 84 as shown in FIG. 7. Such a configuration provides very uniform brightness across the backlight. The waveguide 84 may be formed of a polymer. The LED 82 is generally square, and its sides are at approximately 45 degrees relative to the internally reflective surfaces of the waveguide 84.

Figure 8:
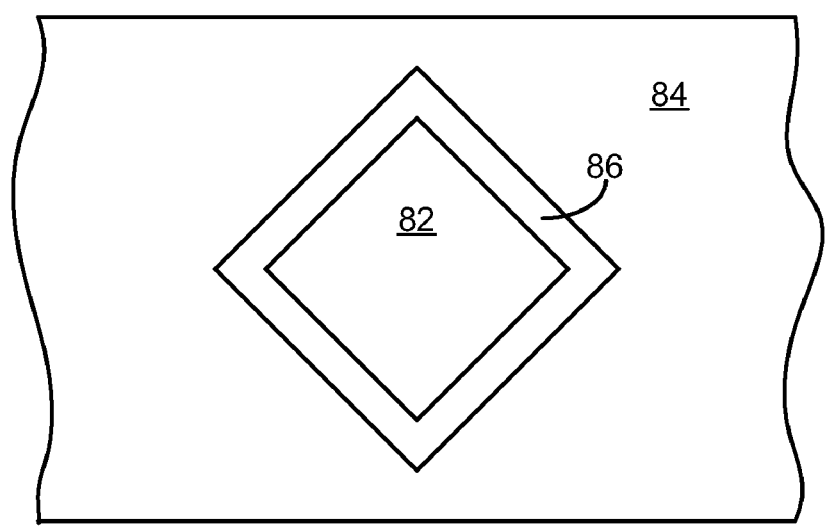
FIG. 8 is a close up view of the LED of FIG. 7 in the backlight.

FIG. 8 is a close up of the LED 82 and the waveguide 84. The waveguide 84 is molded to have a square hole 86 near a back surface. The side walls of the waveguide 84 are coated with a reflective material 88 (FIG. 7). The bottom surface of the waveguide 84 may also be coated with a reflective metal, or the waveguide bottom surface may be angled (like a wedge) so that light is reflected upward by total internal reflection. A small air gap is between the LED 82 and the waveguide material.

Since the LED 82 is at an angle, as shown in FIG. 7, the light emitted from the four sides reflects of the walls of the waveguide 84 and mixes within the waveguide. Since no LED side is parallel to a reflective surface of the waveguide 84, there is no reflection by the waveguide 84 back into the LED.

If light from a conventional LED were simply coupled to a side of the waveguide, the light angle would be compressed by the index of refraction of the waveguide material. Therefore, multiple spaced LEDs would be required and there would be little mixing, resulting in less brightness uniformity across the backlight.

There is a high light-coupling efficiency into the waveguide 84 due to the low profile of the LED 82 and the narrow gap between the LED's emitting surface and the waveguide 84, enabled by the flip-chip structure.

Figure 9:
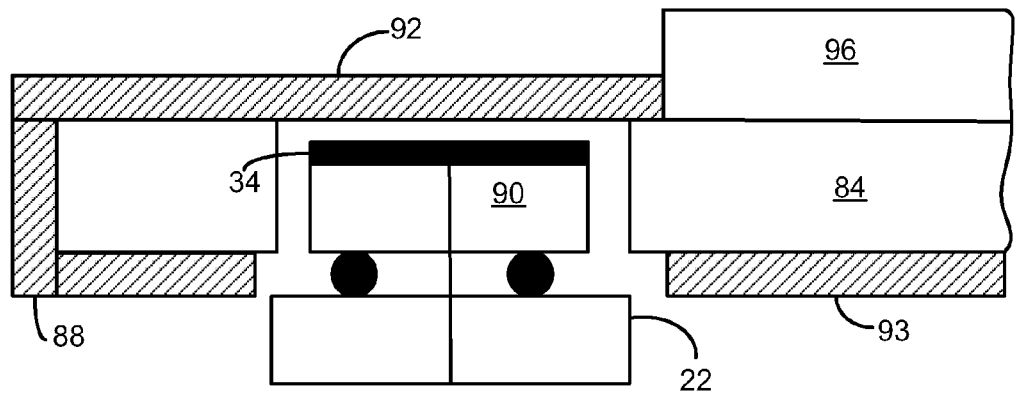
FIGS. 9, 10, and 11 are cutaway side views of different types of LEDs in the backlight of FIG. 7, where the top reflector may be formed directly on the LED or provided by the backlight.
Figure 10:
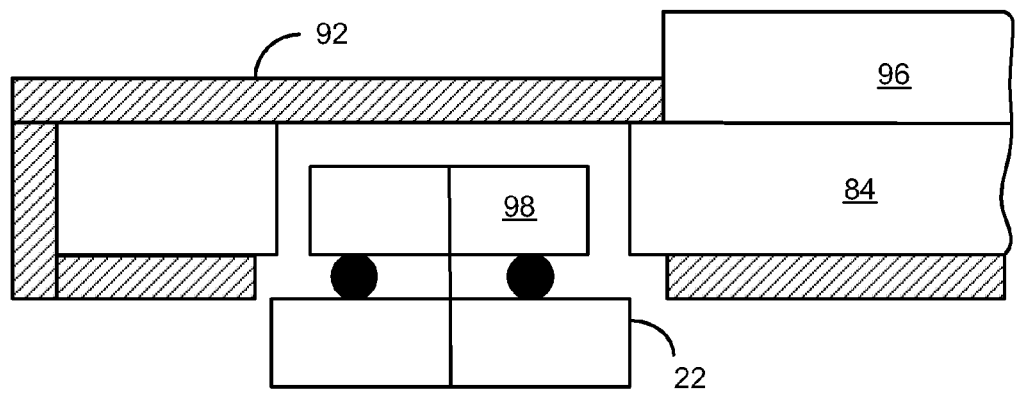
Figure 11:
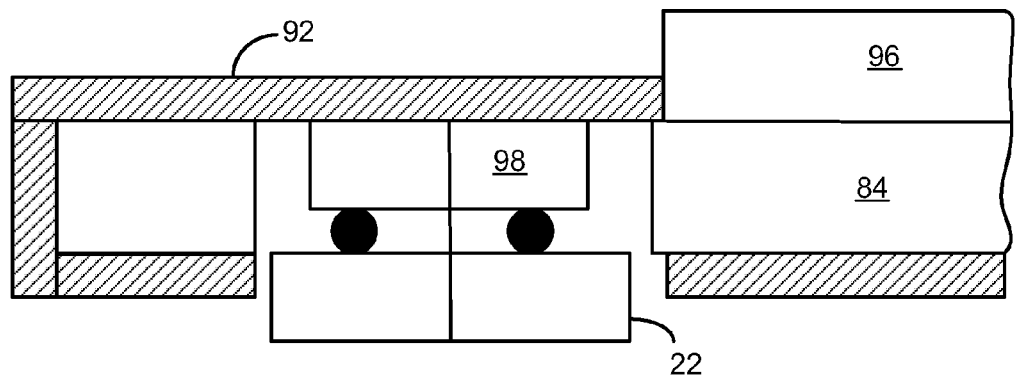

FIGS. 9-11 are cutaway side views of side-emitting LEDs, mounted on submounts, within an opening of the waveguide shown in FIG. 7.

In FIG. 9, the LED 90 has a top reflector 34 so light is emitted from the sides of the LED 90. Reflective metal portions 88, 92, and 93 formed on the non-emitting surfaces of the waveguide 84 cause all light to escape only through the top of the waveguide into the liquid crystal layer 96. Since there are no wire bonds between the LED 90 and the submount 22 and no surrounding materials, such as a lens, there can be a very close spacing or direct contact between the emitting walls of the LED 90 and the waveguide 84. Due to the low profile of the LEDs, the light emitting surface can be 0.2-0.4 mm tall, which is as tall or smaller than the coupling surface of the thin waveguide (e.g., 0.4-0.65 mm). Such a low profile gives a light coupling advantage to the side-emitting LEDs over conventional side-emitting LEDs with emitting surfaces having a height of 0.6 mm or greater.

The completed device of FIG. 9 is a color, transmissive liquid crystal display (LCD), where the backlight emits white light containing red, green, and blue light components.

The liquid crystal layers 96 typically consist of polarizers, RGB filters, a liquid crystal layer, a thin film transistor array layer, and a ground plane layer. The electric fields created at each pixel location, by selectively energizing the thin film transistors at each pixel location, causes the liquid crystal layer to change the polarization of the white light at each pixel location. The RGB filters only allow the red, green, or blue component of the white light to be emitted at the corresponding RGB pixel locations. LCDs are well known and need not be further described.

FIG. 10 illustrates a side emitting LED 98 without a reflective top layer. Instead, the reflective surface 92 of the waveguide causes all light to be redirected sideways into the waveguide portion below the liquid crystal layers 96.

FIG. 11 illustrates the LED 98 with its top surface abutting the reflective surface 92 of the waveguide, resulting in side emission. Using the waveguide's reflector 92 for side emission simplifies manufacturing of the LED. In FIG. 11, the submount 22 is partially inserted into the hole in the waveguide 84.

The side-emitting LED concept is also advantageous for use in compact illuminators, such as for a camera flash, especially a miniature flash in a cell phone camera.

Figure 12:
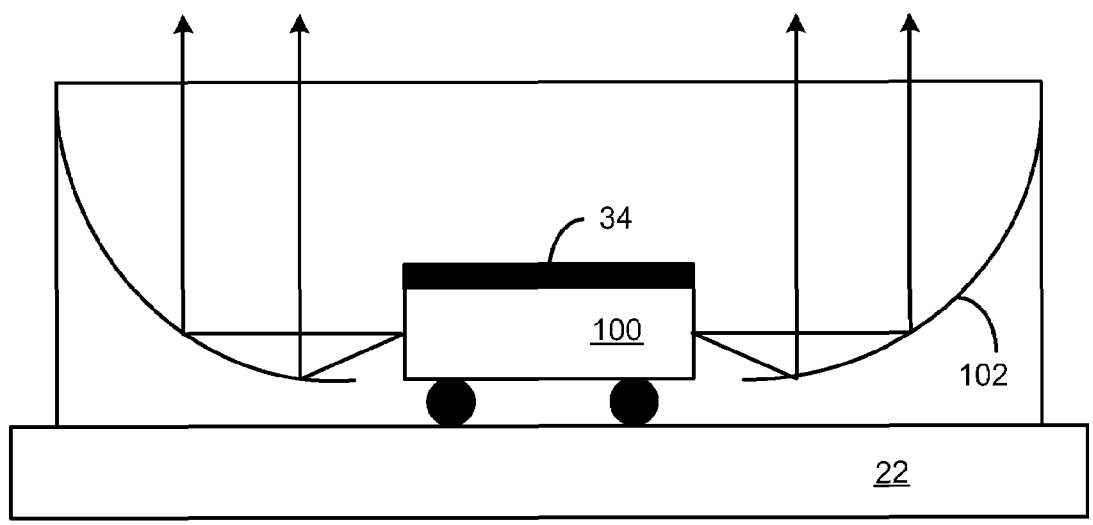
FIG. 12 is a cutaway view of a side-emitting LED mounted in a cup reflector.

FIG. 12 shows how the side-emitted light of LED 100 is collected and redirected by a shaped reflective surface 102, such as a parabolic reflector. The reflector may be an aluminum cup with a center hole for receiving the LED 100. Such an arrangement may be advantageous in a compact flash application for cell phones where a low profile emitter and reflective optics can dramatically reduce package height. The LED 100 emits white light by the use of one or more phosphors, as described with respect to FIGS. 2-5. Prior art flashes for cell phones are typically top-emitting LEDs with a Fresnel lens. The present invention provides advantages over such prior systems and avoids the use of a lens.

Additionally, in prior art flashes using a blue LED with a YAG phosphor, the yellow color of the phosphor is not attractive. The flash design of FIG. 12 avoids visual conspicuity of the YAG phosphor layer, since a reflective layer 34 covers the phosphor. The top reflector 34 even offers design opportunities by allowing choice of color of the top surface of the LED, which can be realized by the attachment of any pigmented surface on top of the reflective layer 34.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A light emitting device comprising:
   a side-emitting, non-lasing, light emitting diode (LED), the LED comprising:
   a first semiconductor layer of a first type;
   a second semiconductor layer of a second type;
   and active layer between the first semiconductor layer and the second semiconductor layer, the active layer having a major surface;
   a first electrode in contact with the first semiconductor layer;
   a second electrode in contact with the second semiconductor layer, the first electrode and the second electrode being on a first side of the LED for being directly connected to electrodes on a submount, the LED being a flip chip;
   a first layer having sides, substantially perpendicular to the major surface of the active layer, through which a majority of light generated in the active layer is emitted, the first layer being thicker than the combination of the first semiconductor layer, the second semiconductor layer, and the active layer;
   a reflector over the first layer, and not part of the first layer, such that substantially all light impinging on the reflector is redirected back into the LED, the reflector comprising a reflective layer substantially completely overlying a top surface of the first layer substantially parallel to the major surface of the active layer, the LED emitting light from all sides of the LED that are substantially perpendicular to the major surface of the active layer;
   a submount, containing electrodes, on which the side-emitting LED is mounted; and
   a backlight, comprising a rectangular backlight waveguide having top and bottom surfaces, into which the LED is mounted such that at least the first layer is between the top and bottom surfaces for coupling side emission from the LED into the backlight waveguide, at least a portion of a thickness of the submount extending below the bottom surface of the backlight waveguide.

2. The device of claim 1 wherein the first layer comprises an LED waveguide.

3. The device of claim 1 wherein the first layer comprises at least one type of phosphor.

4. The device of claim 1 wherein the first layer comprises an LED waveguide, the LED further comprising a phosphor layer at least overlying side surfaces of the LED.

5. The device of claim 1 wherein the first layer comprises at least one type of phosphor and an LED waveguide.

6. The device of claim 1 wherein light emitting sides of the LED have a height between approximately 0.2-0.4 mm.

7. The device of claim 1 wherein the first layer comprises a Ce:YAG phosphor.

8. The device of claim 1 wherein the first layer comprises at least red and green emission phosphors.

9. The device of claim 8 wherein the red and green emission phosphors are formed as different layers as part of the first layer.

10. The device of claim 1 wherein the active layer emits blue light.

11. The device of claim 1 wherein the active layer emits UV light.

12. The device of claim 1 wherein the first layer comprises a phosphor for down converting a wavelength of light emitted by the active layer, the LED further comprising a dichroic mirror between the first layer and the first semiconductor layer for reflecting back into the first layer the wavelength of light emitted by the phosphor but passing the wavelength of light emitted by the active layer.

13. The device of claim 1 wherein the first layer comprises an LED waveguide, the LED further comprising a phosphor layer between the first semiconductor layer and the LED waveguide.

14. The device of claim 1 wherein the first layer has an outer surface, at least side walls of the first layer being roughened for scattering light.

15. The device of claim 1 wherein the first layer has a top surface beneath the reflector that is roughened for scattering light.

16. The device of claim 1 wherein the LED has a rectangular shape with flat sides, and wherein the backlight waveguide has sides that are oblique with respect to the sides of the LED.

17. The device of claim 1 wherein the backlight waveguide has reflective sides.

18. The device of claim 1 further comprising a liquid crystal layer overlying the backlight for selectively controlling pixels in a display screen.

19. The device of claim 1 wherein the reflector overlying the first layer is a reflective surface on the backlight waveguide.

20. The device of claim 1 wherein the reflector overlying the first layer is formed on the first layer.

21. The device of claim 1 wherein the LED emits white light.

22. The device of claim 1 wherein a growth substrate for the first semiconductor layer and the second semiconductor layer has been removed.

23. The device of claim 1 wherein the reflective layer is a diffusing reflector.

24. The device of claim 1 wherein the reflective layer is a specular reflector.

* * * * *